United States Patent
Tao

(10) Patent No.: US 6,410,981 B2
(45) Date of Patent: *Jun. 25, 2002

(54) VENTED SEMICONDUCTOR DEVICE PACKAGE HAVING SEPARATE SUBSTRATE, STRENGTHENING RING AND CAP STRUCTURES

(75) Inventor: Tetsuya Tao, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/176,326

(22) Filed: Oct. 22, 1998

(30) Foreign Application Priority Data

Oct. 24, 1997 (JP) ................................. 9-292941

(51) Int. Cl.$^7$ ............................... H01L 23/12
(52) U.S. Cl. .................. 257/704; 257/778; 257/780; 257/711; 257/699; 257/683; 361/691; 361/692
(58) Field of Search ................. 257/667, 669, 257/675, 684, 683, 704, 706, 707, 710, 688, 711, 738, 730, 686, 778, 729, 699, 780; 361/760, 688, 807, 809, 702, 714, 692, 691

(56) References Cited

U.S. PATENT DOCUMENTS 5,117,281 A * 5/1992 Katsuraoka ................ 357/81
5,767,568 A 6/1998 Tsuruzono
5,881,944 A * 3/1999 Edwards et al. .......... 228/56.3
5,909,057 A * 6/1999 McCormick et al. ....... 257/704
5,956,576 A * 9/1999 Toy et al. .................. 438/125

FOREIGN PATENT DOCUMENTS

| CN | 1132412 A | | 2/1996 |
|---|---|---|---|
| JP | 57-170554 | | 4/1981 |
| JP | 403187247 | * | 8/1991 |
| JP | 5-166954 | | 2/1993 |
| JP | 5-299536 | | 11/1993 |
| JP | 6-132413 | | 5/1994 |
| JP | 8-130268 | | 5/1996 |

* cited by examiner

Primary Examiner—Steven Loke
Assistant Examiner—Luan Thai
(74) Attorney, Agent, or Firm—Foley & Lardner

(57) ABSTRACT

A packaged semiconductor device having high reliability that allows for a large number of pins and that provides good heat removal properties, and that can discharge the high pressure moisture in a gas state from the inside thereof to the exterior. The device includes a strengthening ring arranged around a semiconductor chip that includes a process type electrode and that is mounted on an isolated substrate; a resin to fill spaces between the semiconductor chip and the isolated substrate; and a cap on the semiconductor chip and the strengthening ring, wherein at least one vent is formed perpendicular to the direction of the thickness of the semiconductor chip.

1 Claim, 4 Drawing Sheets

VENTED SEMICONDUCTOR DEVICE PACKAGE HAVING SEPARATE SUBSTRATE, STRENGTHENING RING AND CAP STRUCTURES

BACKGROUND OF THE INVENTION

1. Field of the Invention

The present invention relates to a packaged semiconductor device.

This application is based on patent application No. Hei 09-292941 filed in Japan, the content of which is incorporated herein by reference.

2. Description of the Related Art

In the past, in order to remove the moisture absorbed by a packaged semiconductor device comprising a process type electrode, such as a flip chip, a packaged semiconductor device comprising a vent formed at a cap, and a packaged semiconductor device comprising a vent formed at an isolated substrate have been suggested.

FIG. 6 shows one example of a packaged semiconductor device comprising a vent formed parallel to the direction of the thickness of the semiconductor chip at the isolated substrate.

In FIG. 6, reference symbols 1 to 9 respectively denote a cap 1, a strengthening ring 2, an isolated substrate 3, a semiconductor chip 4, a filler resin 5, a BAG solder bump 6, an adhesive 7, a solder bump 8, and a vent 9.

As shown in FIG. 6, the moisture in the conventional packaged semiconductor device is generally discharged through the vents 9 formed at locations at which the semiconductor chip 4 is not positioned above the isolated substrate 3.

In a second example of a packaged semiconductor device the moisture is discharged through a vent 10 formed parallel to the direction of the thickness of the semiconductor chip in the cap 1 of the packaged semiconductor device as shown in FIG. 7. It is not necessary to form the vent 9 in the isolated substrate 3 as shown in FIG. 7; therefore, it is possible to increase the density of electrical wirings on the isolated substrate 3, in response to the tendency of increasing pins.

When the packaged semiconductor device is loaded on the print substrate using a connecting material such as a conventional solder, the connection between the packaged semiconductor device and the print substrate is formed by heating the connecting material to higher than the melting temperature thereof using a reflowing oven, thereby the connecting material melts, cools and solidifies. The packaged semiconductor device is heated in this case; therefore, the moisture absorbed inside of the packaged semiconductor device vaporizes, or the air in the cavities formed inside of the packaged semiconductor device expands. Consequently, the pressure inside of the packaged semiconductor device is suddenly increased. Thus, the stress inside of the packaged semiconductor device is high, and the semiconductor package may crack; therefore, the reliability of the packaged semiconductor device is decreased. In order to maintain the reliability of the conventional packaged semiconductor device, the stress operating on the packaged semiconductor device is decreased by removing the moisture through the vents 9 and 10 shown in FIGS. 6 or 7.

The electrodes for connecting the semiconductor chip 4 and the isolated substrate 3, and the electrical wirings are arranged on and around the isolated substrate 3 side by side in the conventional packaged semiconductor device. Therefore, when the vents 9 are to be formed at locations at which the semiconductor chip 4 is not positioned above the isolated substrate 3, the problem arises that the greater the number of pins, the greater the difficulty in securing locations for the vents. Moreover, the diameter of the vents 9 is made small in order to secure locations for formation of the vents 9, and the problem of increasing costs arises. Moreover, the BGA solder balls 6 for loading the packaged semiconductor device are put on the underside of the isolated substrate 3; therefore, the vents 9 should be formed between these BGA solder balls 6. Accordingly, when the packaged semiconductor device is loaded on a print board such as a mother board, flux and clearing solvent for the flux enter the vents 9, as a result, permeability of the packaged semiconductor device becomes worse.

Because of these reasons, it gradually becomes difficult to form the vents 9 in the isolated substrate 3.

In addition, formation of the vents 10 in the cap 1 as shown in FIG. 7 has been suggested. When a heat sink is put on the cap 1 in order to improve heat loss properties, the problem arises that the vents 10 are covered with the heat sink; therefore the permeability of the packaged semiconductor device cannot be insured. Moreover, the heat generated in the packaged semiconductor device is removed by contacting the surface of the semiconductor chip to the cap 1 in a flip chip package. Therefore, when the vents 10 are formed in the cap 1 as shown in FIG. 8, the area for heat transfer is small. Consequently, the heat loss properties of the packaged semiconductor device become worse.

SUMMARY OF THE INVENTION

It is therefore an object of the present invention to provide a packaged semiconductor device having high reliability which can solve the problems caused by the loading of a large number of pins, that is, the density of the electrical wirings becomes high, and the decreased heat loss properties thereof, and which can discharge the high pressure moisture in a gas state from the inside thereof to the exterior.

According to an aspect of the present invention, the present invention provides a packaged semiconductor device comprising:

a strengthening ring arranged around a semiconductor chip that includes a process type electrode and that is mounted on an isolated substrate;

a resin to fill spaces between the semiconductor chip and the isolated substrate; and a cap arranged on the semiconductor chip and the strengthening ring, wherein at least one vent is perpendicularly formed to the direction of the thickness of the semiconductor chip.

According to the packaged semiconductor device of the present invention, the permeability of the vents can be secured. Therefore, it is possible to remove the high pressure moisture in a gas state from the inside thereof to the exterior, and to prevent the occurrence of cracks therein. Consequently, the reliability of the packaged semiconductor device is improved.

Moreover, additional vents can be formed in the various isolated substrates, and caps.

However, it is not necessary to form the vents in the isolated substrates and the caps; therefore, the packaged semiconductor devices of the present invention can meet the tendency to increase the number of pins.

In particular, when the vents are formed at the boundary between the cap and the strengthening ring, or the boundary between the strengthening ring and the isolated substrate, a packaged semiconductor device having high reliability with low cost can be more easily obtained.

Moreover, when the strengthening ring is comprised of strengthening ring segments, the vents are formed at spaces between the strengthening ring segments, and the vents can be formed by arrangement of the strengthening ring segments. The packaged semiconductor device can be more easily obtained than the above packaged semiconductors of the present invention; and can decrease the cost.

According to another aspect of the present invention, the present invention provides a cap for a packaged semiconductor device, wherein vents are formed perpendicular to the direction of the thickness thereof.

According to another aspect of the present invention, the present invention provides a strengthening ring for a packaged semiconductor device, wherein vents are formed perpendicular to the direction of the thickness thereof.

DESCRIPTION OF THE PREFERRED EMBODIMENTS

Figure 6:
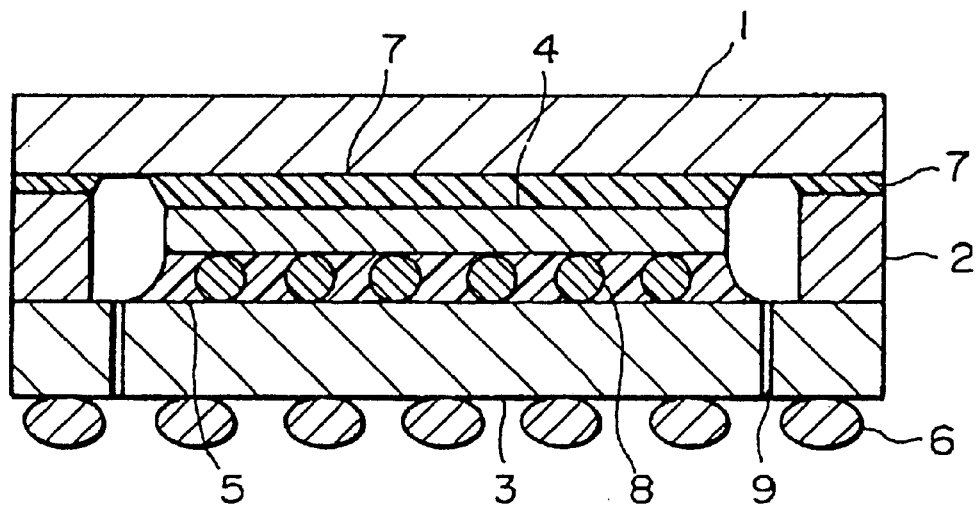
FIG. 6 is a cross-sectional view showing the conventional packaged semiconductor device comprising vents formed parallel to the direction of the thickness of the semiconductor chip at the isolated substrate.
Figure 7:
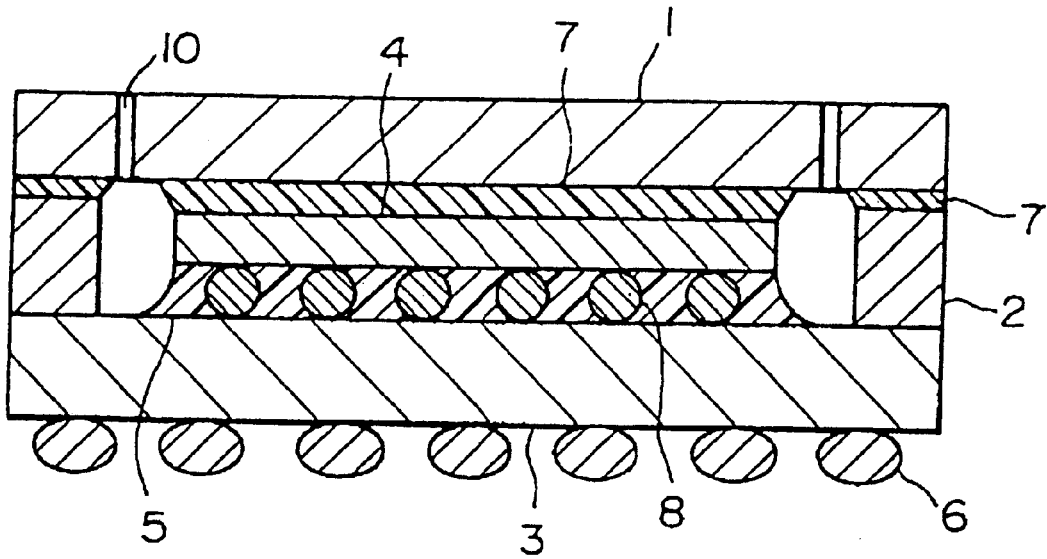
FIG. 7 is a cross-sectional view showing the conventional packaged semiconductor device comprising vents formed parallel to the direction of the thickness of the semiconductor chip at the cap.
Figure 8:
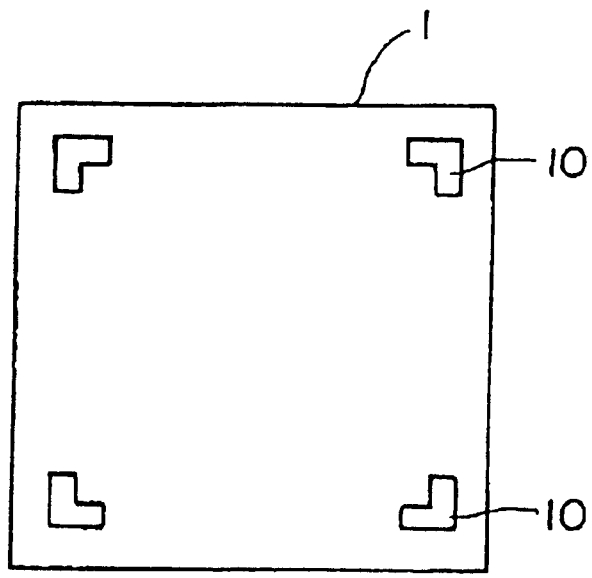
FIG. 8 is a schematic plan view showing the cap comprising the packaged semiconductor device shown in FIG. 7.

A detailed explanation will now be made of the packaged semiconductor device of the present invention using FIGS. 1 to 5. Moreover, in order to simplify the explanations regarding to the compositions shown in FIG. 1 to 5, features corresponding to those shown in FIGS. 6 to 8 are assigned the same reference symbols as used in reference to FIGS. 6 to 8.

Figure 1:
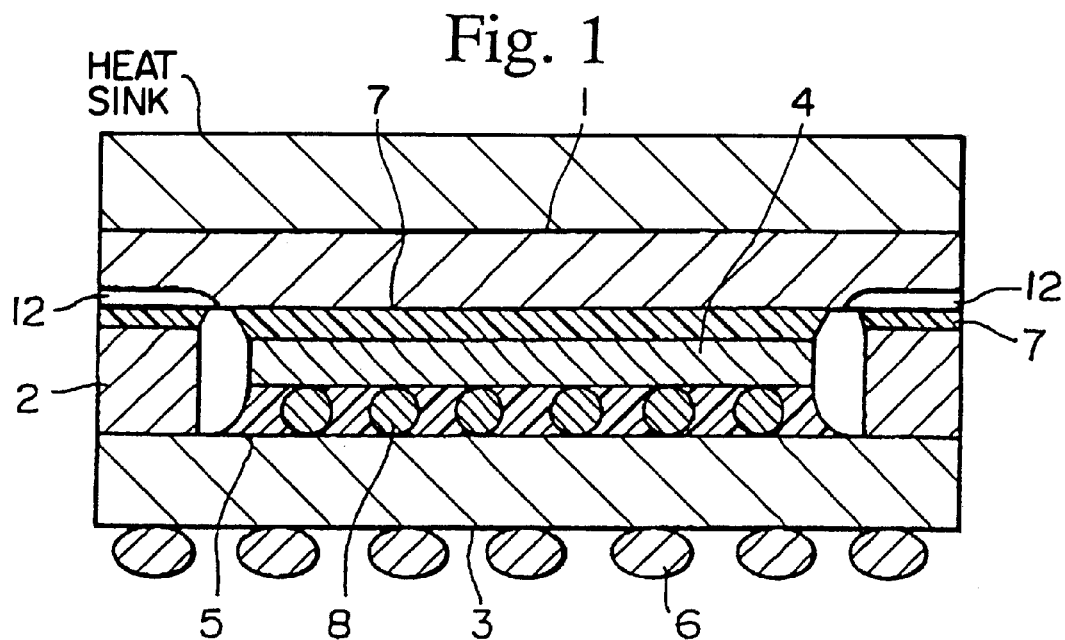
FIG. 1 is a cross-sectional view showing the packaged semiconductor device of the first embodiment of the present invention.

The packaged semiconductor device shown in FIG. 1 is formed by mounting the semiconductor chip 4 having a process type electrode such as solder bumps 8 having a diameter of 150 μm on the isolated substrate 3; filling spaces between the solder bumps 8 and the isolated substrate 3 with a filling resin 5 such as epoxy resin; solidifying the resin; adhering the strengthening ring 2 made of copper; adhering the solder balls 6 having a diameter of 0.6 mm on the isolated substrate 3; coating an adhesive 7 such as epoxy resin to the surface of the semiconductor chip 4 and the surface of the strengthening ring 2; and adhering the cap that has grooves 12 having a width of 2 mm (shown in FIGS. 2A and 2B) to the semiconductor chip 4 and the strengthening ring 2 via the adhesive 7.

Figures 2A, 2B:
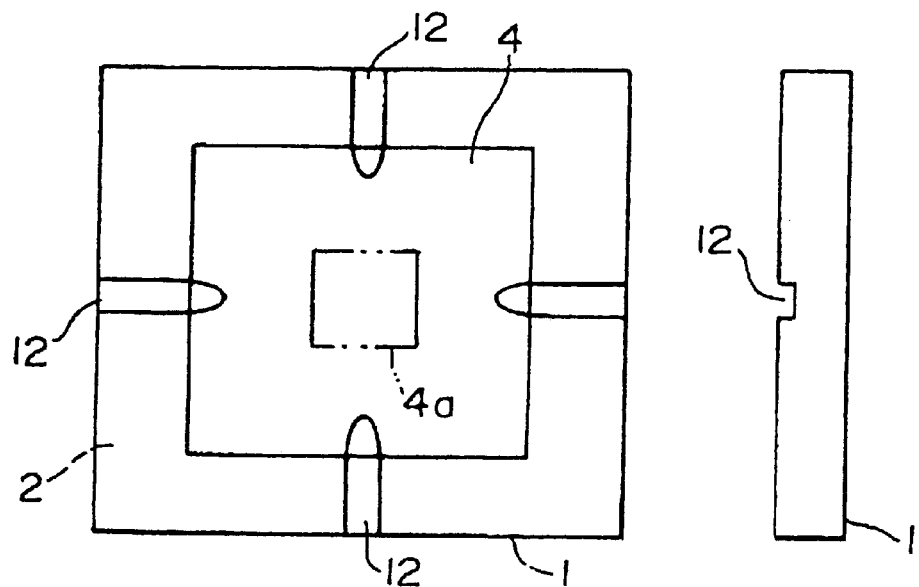
FIG. 2A is a schematic plan view showing the cap comprising the vents used in the packaged semiconductor device shown in FIG. 1.
FIG. 2B is a schematic side face view showing the cap comprising the vents used in the packaged semiconductor device shown in FIG. 1.

FIGS. 2A and 2B show the cap used in the present embodiment. Moreover, in FIG. 2A, reference symbol 4a denotes the semiconductor circuit positioned at the center of the semiconductor chip 4. A plurality of grooves 12 are formed at the margins of the cap 1.

As shown in FIG. 1, the cap is adhered to the strengthening ring 2 and the semiconductor chip 4 by the adhesive 7. The cap 1 is adhered to the surface of the semiconductor chip 4 and the surface of the strengthening ring 2 so as not to fill the grooves 12, which form the vents 12, with the adhesive 7.

The semiconductor package comprising the cap 1 of this embodiment has excellent permeability. Moreover, it is possible to sufficiently remove the moisture absorbed by the packaged semiconductor device through the grooves 12, that is, the vents 12, formed at the cap 1 of the present embodiment.

Figure 3:
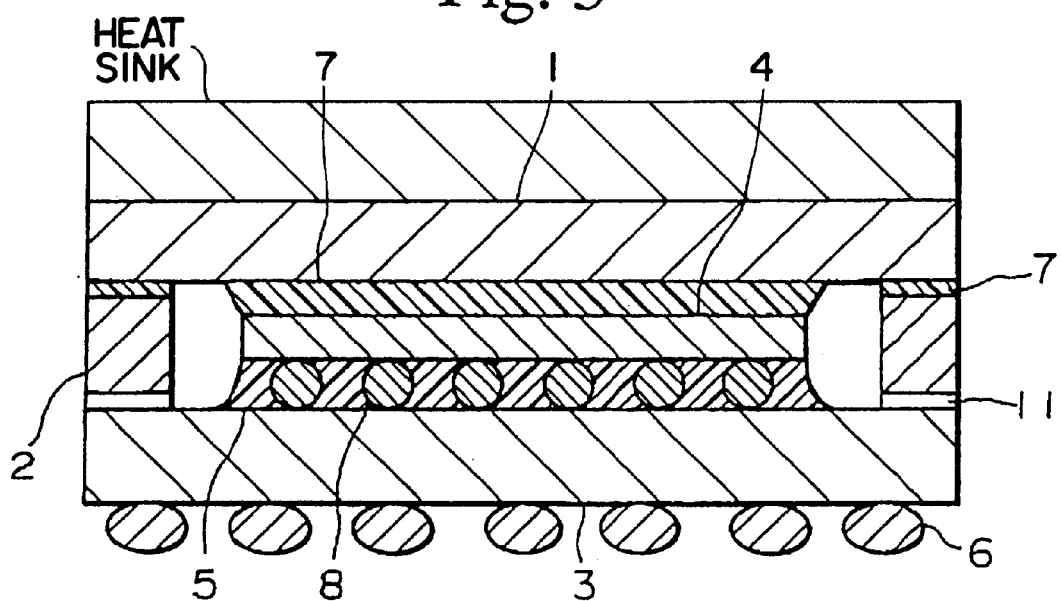
FIG. 3 is a cross-sectional view showing the strengthening ring used in the packaged semiconductor device of the second embodiment of the present invention.
Figures 4A, 4B:
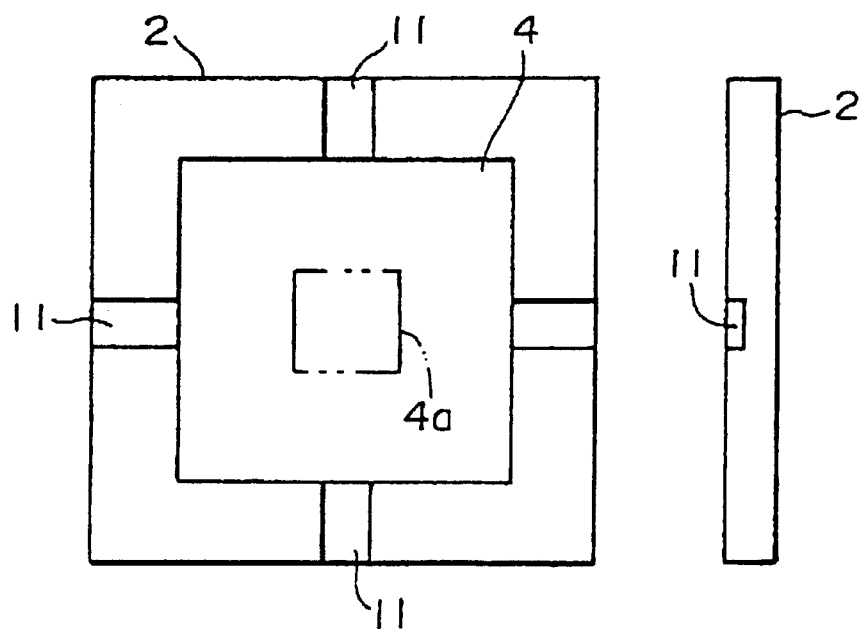
FIG. 4A is a schematic plan view showing the strengthening ring comprising the vents used in the packaged semiconductor device shown in FIG. 3.
FIG. 4B is a schematic side face view showing the strengthening ring shown in FIG. 3.

FIG. 3 shows a cross-sectional view of the packaged semiconductor device of the second embodiment of the present invention. The packaged semiconductor device was formed in the same manner as in the first embodiment, except that a strengthening ring 2 that has grooves 11, which form the vents 11, was adhered to the cap 1, instead of adhering a cap 1 that has grooves 12, which form the vents 12 to the semiconductor chip 4 and the strengthening ring 2. Moreover, the strengthening ring 2 is also adhered to the cap 1 so as not to fill the grooves 11, which form the vents 11 with the adhesive 7.

The semiconductor package comprising the strengthening ring 2 of this embodiment has excellent permeability. Moreover, it is possible to sufficiently remove the moisture absorbed by the packaged semiconductor device through the groove 11, that is, the vents 11, formed at the strengthening ring 2 of the present embodiment.

Figure 5A:
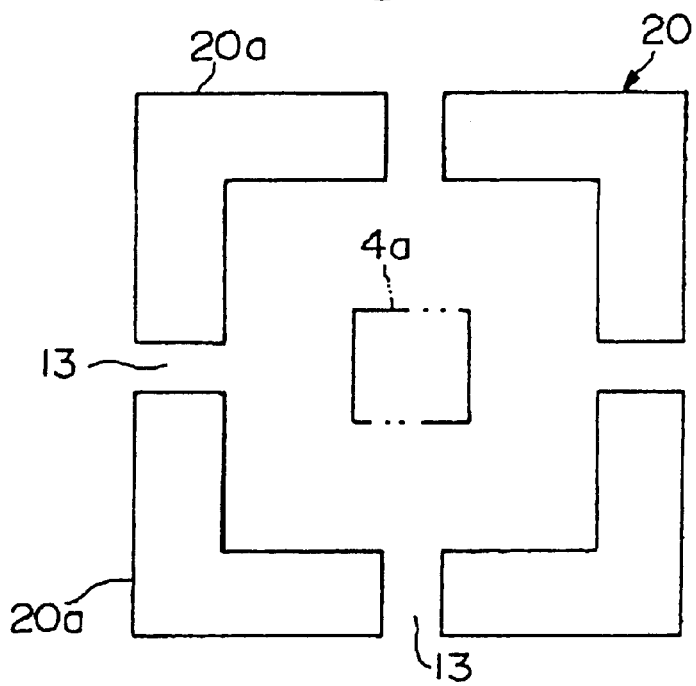
FIG. 5A is a schematic plan view showing strengthening ring segments of the packaged semiconductor device of the third embodiment of the present invention.
Figure 5B:
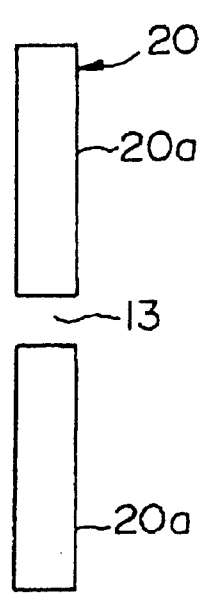
FIG. 5B is a schematic side face view showing the strengthening ring segments of the packaged semiconductor device of the third embodiment of the present invention.

FIG. 5 shows a plan view of the strengthening ring 20 used in the third embodiment of the present invention. The strengthening ring 20 comprises strengthening ring segments 20a made of copper. These strengthening ring segments 20a are positioned on the isolated substrate 3 so as to surround the semiconductor chip 4. The structure of the packaged semiconductor device obtained using these strengthening ring segments 20 is practically same as the structure of the packaged semiconductor device shown in FIG. 1.

The semiconductor package comprising the strengthening ring segments 20a of this embodiment has excellent permeability. Moreover, it is possible to sufficiently remove the moisture absorbed by the packaged semiconductor device by the spaces 13, which form the vents 13 between the strengthening ring segments 20a of the present embodiment. In addition, the width of these spaces 13 can be easily controlled.

These vents 11, 12, and 13 are formed at the surface of the cap 1 at which the cap 1 does not contact the heat sink, or at the strengthening ring 2 in these present embodiments; therefore, it is possible to secure the permeability of these vents 11, 12, and 13 even when a heat sink is mounted on the packaged semiconductor device to secure the heat removal properties thereof.

Moreover, the vents 11, 12, and 13 are not formed at the surface of the cap 1 at which the cap 1 contacts the heat sink and the isolated substrate 3 for heat lose from the semiconductor chip 4; therefore, areas of sufficient dimensions for heat removal can be secured. Consequently, the present packaged semiconductor devices have excellent heat removal properties.

Furthermore, the rate of crack occurrence of the conventional packaged semiconductor device having the vents 9 at the isolated substrate 3 as shown in FIG. 6, and of the conventional packaged semiconductor device having the vents 10 formed at the cap 1 as shown in FIG. 7 is approximately 40%. In contrast, the packaged semiconductor devices of these embodiments of the present invention have no cracks. In addition, the vents of the present embodiments can be formed at cap 1 and the strengthening ring 2 respectively, irrespective of the kinds of the semiconductor chips 4, and the isolated substrate 3. Therefore, the packaged semiconductor devices of the present invention allow for the tendency for increasing numbers of pins.

What is claimed is:

1. A semiconductor package comprising:

a semiconductor flip chip mounted on an isolated substrate and having a process type electrode;

a strengthening ring mounted on the substrate and surrounding the semiconductor chip;

a resin filling space between the semiconductor chip and the isolated substrate; and a cap separate and distinct from said stregthening ring, said cap mounted on the semiconductor chip via an adhesive so as to substantially completely cover and contact a top surface of said semiconductor chip without an air cavity therebetween, said cap further mounted, via an adhesive, to the strengthening ring, the semiconductor package having defined therein at least one vent that is perpendicular to the direction of the thickness of the semiconductor chip; and wherein said at least one vent is formed at the surface of the cap at which the cap contacts the strengthening ring.

* * * * *